(12) United States Patent  (10) Patent No.: US 8,168,506 B2
Herner  (45) Date of Patent: May 1, 2012

(54) ON/OFF RATIO FOR NON-VOLATILE MEMORY DEVICE AND METHOD

(75) Inventor: Scott Brad Herner, San Jose, CA (US)

(73) Assignee: Crossbar, Inc., Santa Clara, CA (US)

( * ) Notice: Subject to any disclaimer, the term of this patent is extended or adjusted under 35 U.S.C. 154(b) by 0 days.

(21) Appl. No.: 12/835,699

(22) Filed: Jul. 13, 2010

(65) Prior Publication Data

US 2012/0012806 A1  Jan. 19, 2012

(51) Int. Cl.
*H01L 21/20* (2006.01)
(52) U.S. Cl. .................. 438/381; 257/E21.003
(58) Field of Classification Search .................. 438/381; 257/E21.003
See application file for complete search history.

(56) References Cited

U.S. PATENT DOCUMENTS

2010/0019310 A1* 1/2010 Sakamoto ..................... 257/324
* cited by examiner

*Primary Examiner* — Alexander Ghyka
*Assistant Examiner* — Stanetta Isaac

(74) *Attorney, Agent, or Firm* — Ogawa P.C.

(57) ABSTRACT

This application describes a method of forming a switching device. The method includes forming a first dielectric material overlying a surface region of a substrate. A bottom wiring material is formed overlying the first dielectric material and a switching material is deposited overlying the bottom wiring material. The bottom wiring material and the switching material is subjected to a first patterning and etching process to form a first structure having a top surface region and a side region. The first structure includes at least a bottom wiring structure and a switching element having a top surface region including an exposed region of the switching element. A second dielectric material is formed overlying at least the first structure including the exposed region of the switching element. The method forms a first opening region in a portion of the second dielectric layer to expose a portion of the top surface region of the switching element. A dielectric side wall structure is formed overlying a side region of the first opening region. A top wiring material including a conductive material is formed overlying at lease the top surface region of the switching element such that the conductive material is in direct contact with the switching element. The side wall spacer reduces a contact area for the switching element and the conductive material and thus a reduced active device area for the switching device. In a specific embodiment, the reduced area provides for an increase in device ON/OFF current ratio.

30 Claims, 13 Drawing Sheets

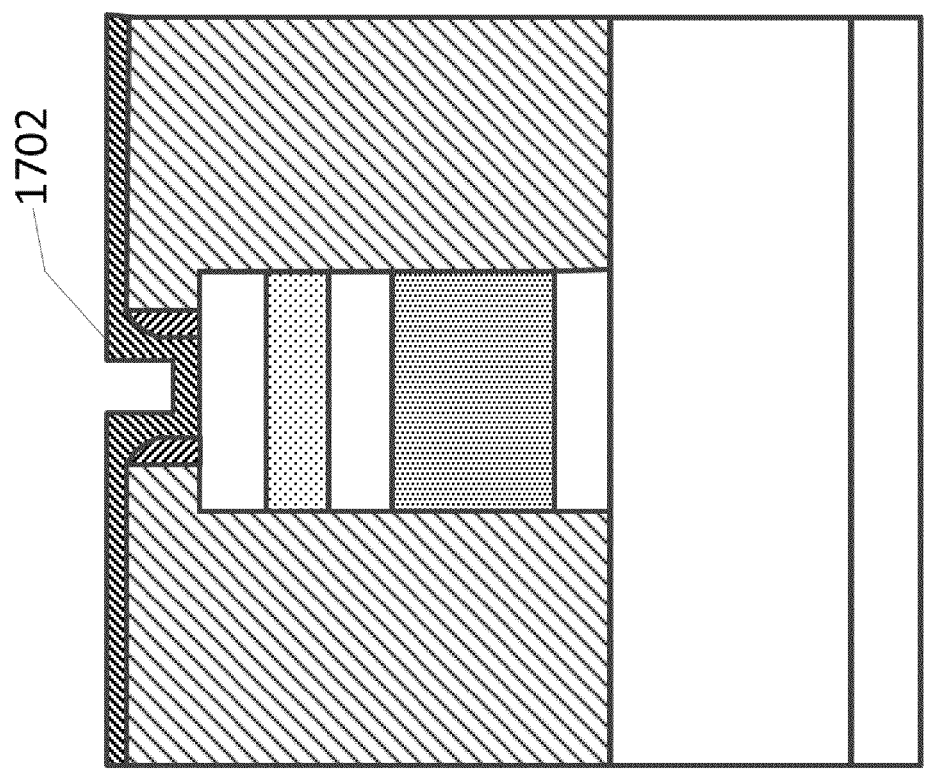

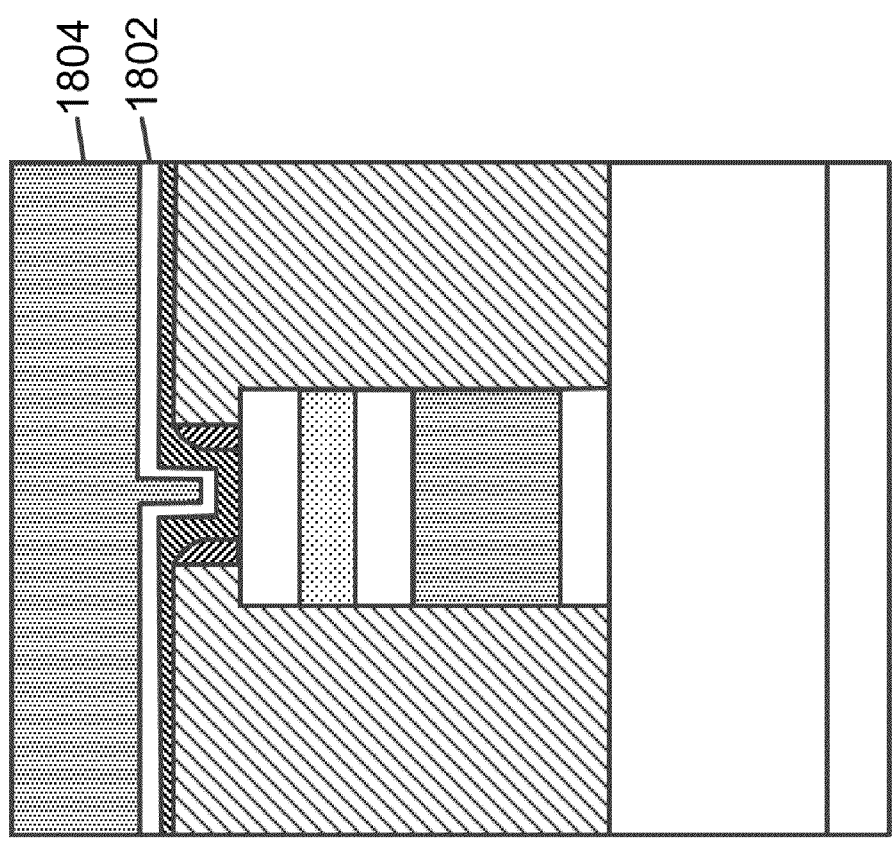

ON/OFF RATIO FOR NON-VOLATILE MEMORY DEVICE AND METHOD

BACKGROUND

The present invention is in general related to switching devices. More particularly, embodiments of the present invention provide a method and a structure for a resistive switching device. The resistive switching device can be used in a non-volatile resistive switching memory device with random access and fast switching characteristics.

Semiconductor memory cells usually include a transistor device. Scaling of memory devices is therefore driven by reducing the size of the transistor. However, fundamental difficulties with scaling commonly used memory cells, such as those using floating gates, are driving the industry to examine a new memory cell structure that will allow scaling to ever smaller dimensions. New classes of memory devices being actively investigated include ferroelectric RAM (Fe RAM), magneto-resistive RAM (MRAM), organic RAM (ORAM), and phase change RAM (PCRAM). These devices usually attempt to use new materials and combine with silicon based devices to create a memory cell.

These new memory cells are often limited in certain desirable attributes. For example, shrinking the device size may not be not possible, or the device may lack high speed switching. For example, Fe-RAM and MRAM devices have fast switching characteristics but scaling them to small sizes is rather difficult. One of the factors that limits the ability to reduce MRAM size is the number of contacts, or terminals, needed to enable the device. A MRAM cell has at least three terminals. A MRAM cell containing at least one transistor coupled with a magnetic switch has a size of $16F^2$, or greater, where F is the printed feature size. For a PCRAM, in which switching occurs when a material is changed from a conductive polycrystalline phase to a less conductive amorphous phase, a relatively large amount of power is needed to switch the device, resulting in slow program/erase for large files. ORAM is usually incompatible with large volume silicon based fabrication. Key attributes of a memory cells should include: the ability to scale to a small size, fast switching speeds, low power consumption, low fabrication cost, long endurance (the ability to read, program, and erase the device multiple times without degradation), and compatibility with current large volume silicon fabrication processes, among others.

Because of these limitations, an improved semiconductor device structure for memory devices is therefore desirable.

BRIEF SUMMARY OF THE PRESENT INVENTION

The present invention is in general related to switching devices. More particularly, embodiments of the present provide a method and a structure for a resistive switching device. The resistive switching device can be used in a non-volatile resistive switching memory with random access and fast switching characteristics. However, it should be recognized that the present invention can have a broader range of applicability.

In a specific embodiment, a method for forming a switching device is provided. The method includes providing a substrate. The substrate can be a semiconductor having one or more transistor devices formed thereon. The method includes forming a first dielectric material overlying a surface region of the substrate and depositing a bottom conductive material stack overlying the dielectric material. The bottom conductive material stack may comprise of one or more layers. In a specific embodiment, the method deposits a switching material overlying the first conductive material stack. A masking layer is formed overlying the switching material. In a specific embodiment, the method subjects the bottom conductive material stack and the switching material to a first etching process using the masking layer to form a first structure, and to expose a surface region of the first dielectric material. In a specific embodiment, the first structure, including at least a first conductive material stack and a switching element, has a top surface region and a side region. A second dielectric material is formed overlying the first structure and the exposed portion of the first dielectric material. The method includes forming a planarized second dielectric surface region and maintaining a portion of the second dielectric material overlying the top surface region of the first structure. In a specific embodiment, the method forms a first opening region in the second dielectric layer to expose a portion of the top surface region of the first structure. The first opening region has a side region and a bottom region. The bottom region includes the exposed top surface region of the switching element and has a first area. A third dielectric material is formed conformably overlying at least the first opening region. The third dielectric material is subjected to a nonconformal etching process or an anisotropic etching process to form a second opening region in a specific embodiment. The nonconformal etching process removes a first portion of the third dielectric material to expose a first portion of the bottom region with a second area while a second portion of the third dielectric material remains on the side region to form a sidewall structure overlying the side region of the first opening region. In a specific embodiment, the second area of the exposed switching material is smaller than the first area of the exposed switching material. The method includes depositing a conductive material overlying the exposed portion of the bottom region and the sidewall structure. In a specific embodiment, the conductive material is in contact with the switching element. A top wiring is formed by a second etching process to form a top wiring structure. The top wiring structure is in electrical contact with the switching material. The top wiring structure and the bottom wiring structure are arranged at an angle, including orthogonally, in a specific embodiment.

In an alternative embodiment, a switching device is provided. The switching device includes a substrate and a first dielectric material overlying the substrate. A bottom wiring structure overlies the first dielectric material. In a specific embodiment, the switching device includes a first structure comprising at least a contact material overlying the bottom wiring structure and a switching material overlying the contact material. The first structure includes a top surface region and a side region. The top surface region includes a top region of the switching material in a specific embodiment. The switching device includes a second dielectric layer overlying the first structure. The switching device includes a side wall spacer structure is provided in a first opening region of the second dielectric layer overlying the top surface region of the switching material. The side wall spacer structure is formed using a third dielectric material. The switching device includes a top wiring structure overlying the switching material. In a specific embodiment, a portion of the top wiring structure includes a conductive material in contact with the switching material.

Many benefits can be achieved by ways of the present invention. As merely an example, the present method provides a method and a structure for fabricating a switching device having an improved switching characteristic such as a greater ratio of the "on" current during read, Ion, to the "off" current during read, Ioff. Such an improvement is realized by providing a reduced active device area for switching, for example less than about 50 nm. Conventionally, this reduction of active area can be realized by using a lithography mask having fine feature size. But the cost of fabricating such a mask can be prohibitively high. Also, yield (defined by, or number of "good" die divided by the total number of die on a wafer), for a step with an extremely small lithographically printed feature size is reduced compared to the yield for a step with a larger feature size. The present method uses a dielectric spacer structure to provide a reduced active area for switching and eliminating a costly and potentially low yield lithography process. In addition, the present method can provide flexibility for device design by allowing adjustment for the active device area and improving device performance and yield. Depending on the embodiment, one or more of these benefits may be realized. One skilled in the art would recognize other variations, modifications, and alternatives.

SUMMARY OF THE DRAWINGS

FIGS. 3-18 are simplified diagrams illustrating a method of forming a two terminal switching devices according to an embodiment of the present invention.

DETAIL DESCRIPTION OF THE PRESENT INVENTION

The present invention is in general related to switching devices. More particularly, embodiments of the present invention provide a method and a structure for a resistive switching device. The resistive switching device may be used in non-volatile memory devices that provide for random access, fast switching, and are scalable to very small sizes. But it should be recognized that the present invention can have a much broader range of applicability.

Resistive switching behavior has been observed and studied in micrometer-scale amorphous silicon (a-Si) devices since the 1980s. A typical device consists of a pair of metal electrodes sandwiching an amorphous-Si layer in a so-called Metal/a-Si/Metal (M/a-Si/M) structure, in which the voltage applied across the pair of metal electrodes may cause changes in the a-Si resistance. These conventional M/a-Si/M based nonvolatile switching devices have the advantages of high Ion/Ioff ratios, and can be fabricated with a CMOS compatible fabrication process and materials. Due to the highly resistive a-Si material, the as-fabricated devices have a high resistance and negligible current flow between the top and bottom electrodes during read. Before these devices can be used as a switching device, a high voltage forming process (typically greater than 10 V) is used to transform the as-fabricated device into a low resistance state. This high voltage significantly reduces device yields, as some devices can be destroyed by the high voltage. This high forming voltage is increasingly destructive as the device is scaled down to smaller sizes, such as nanometer-sized range.

Figure 1:
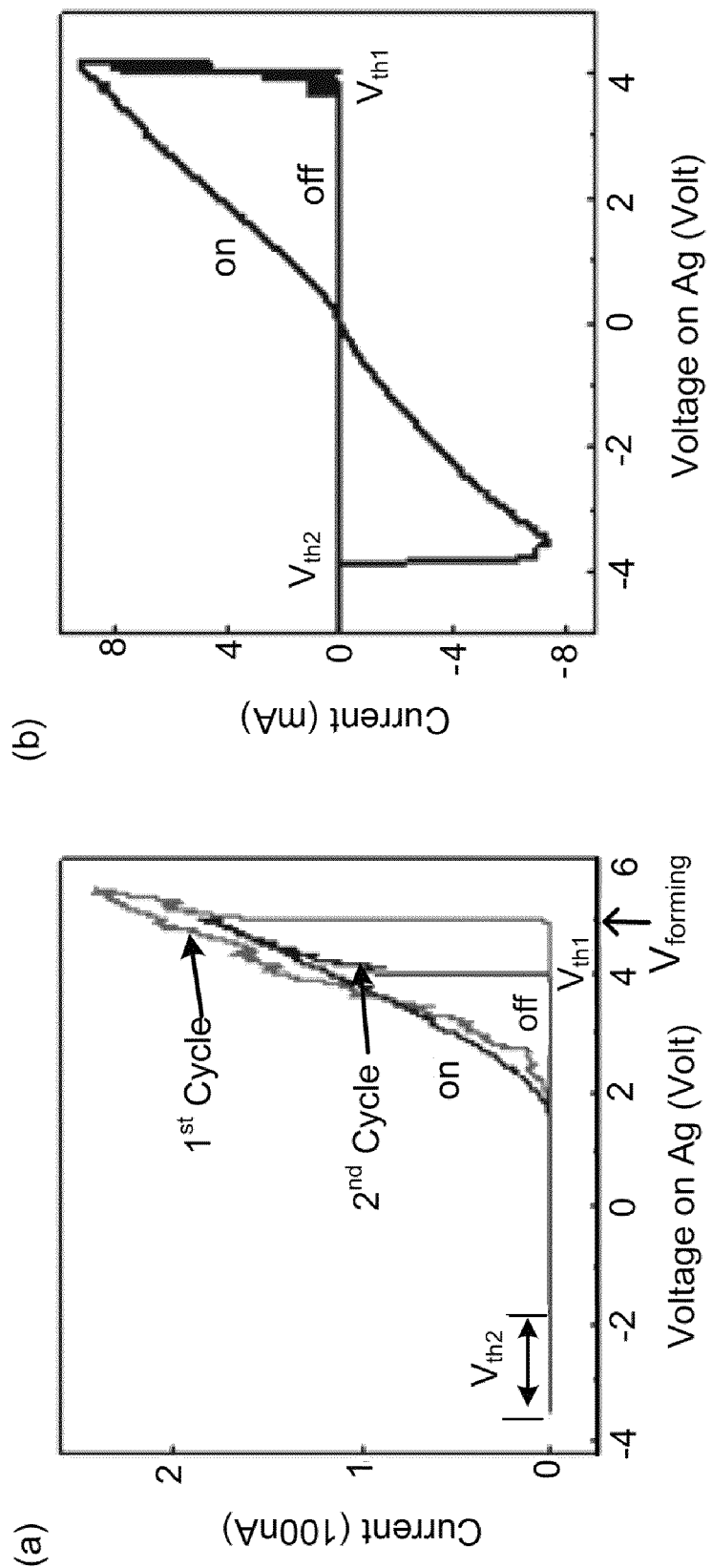
FIG. 1 illustrates simplified current versus voltage (IV) plots of a resistive switching device.

Embodiments of the present invention use a Metal/amorphous-Si/p+ polycrystalline silicon structure. This structure has a much smaller forming voltage $V_{th1}$, ranging from about 3 volts to 4 volts depending on the deposition method of the amorphous Si layer and the type of the top metal material. The resistance of the device is suddenly reduced once the forming voltage is applied. The device is turned on and significant current flows through the device, as shown in FIG. 1. If a voltage of opposite polarity (negative voltage in this case) is applied on the top metal electrode greater than a threshold $V_{th2}$, typically ranging from −2 V to −4 V in magnitude, the device is changed back into a high resistance state, i.e., in an "off" state. The OFF state resistance can be comparable to the resistance of as-fabricated devices. The device state resistance is not affected if the applied voltage is between the $V_{th1}$ and $V_{th2}$. The ratio between the currents at ON state and OFF states, or $I_{on}/I_{off}$, ranges from about $10^3$ to about $10^7$ depending on the device type.

Figure 2:
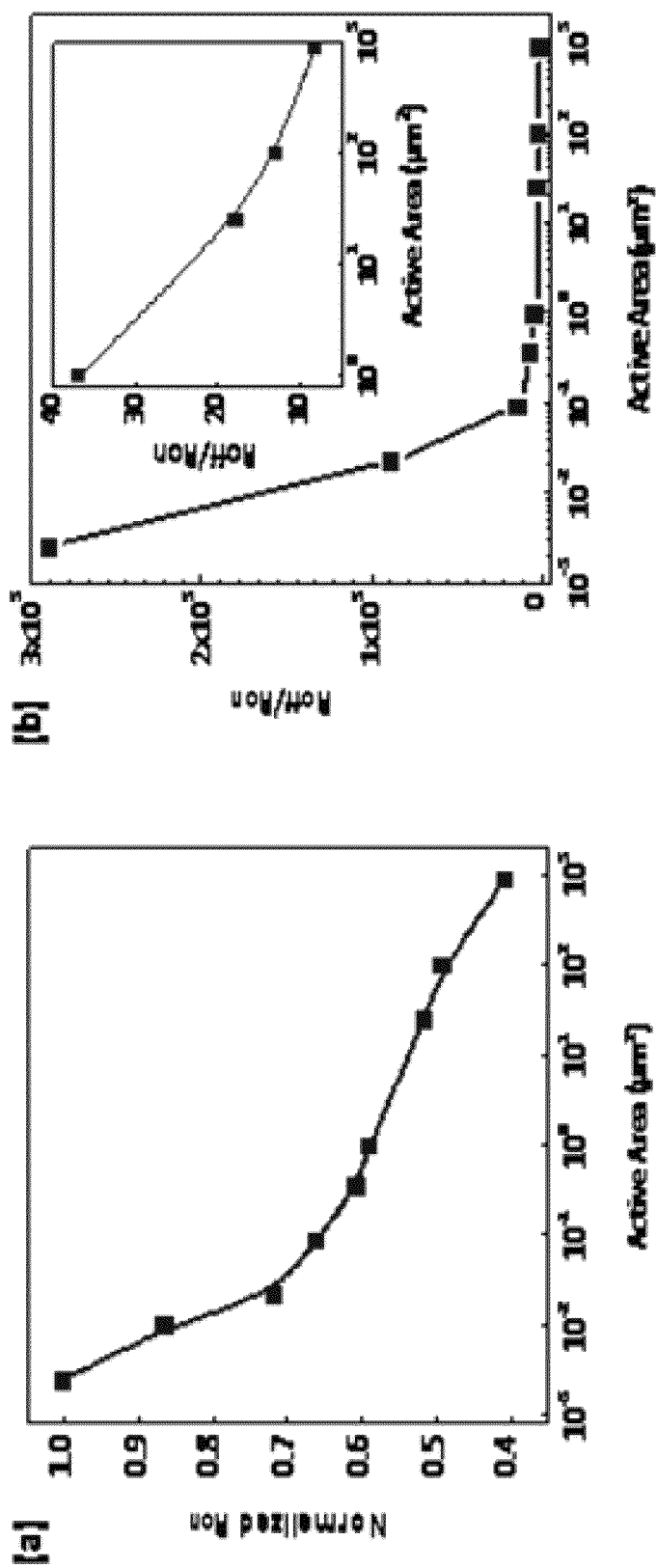
FIG. 2 illustrates simplified plots of the dependence of device resistance on active device area at ON state and at OFF state.
Figure 3:
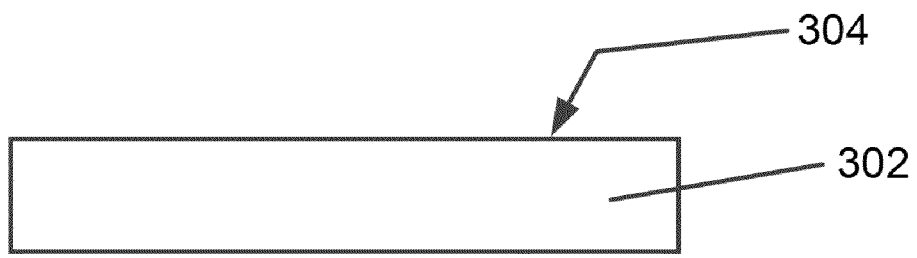

FIG. 2 shows the dependence of ON state resistance on active device area. As shown, the on-resistance increases only 2.5 times when the active device area is reduced by 6 orders of magnitude in size. Therefore, the ON state resistance or ON state current is relatively insensitive to the total device area. In the OFF state, conduction is dominated by leakage through the amorphous Si layer. The OFF state current $I_{off}$ is inversely proportional to the device area and sensitive to the total device area. As a result, the $I_{on}/I_{off}$ ratio can be increased by making smaller devices, which is an effect that actually favors down scaling of device sizes. An improved $I_{on}/I_{off}$ ratio improves a signal-to-noise ratio for selected devices during read, allowing for a large and high density array of devices, thereby reducing costs of fabrication.

Accordingly, the present invention provides a method and a structure for forming a switching device, in particular, a resistance switching device having a reduced active device area to increase an $I_{on}/I_{off}$ ratio.

Figure 4:
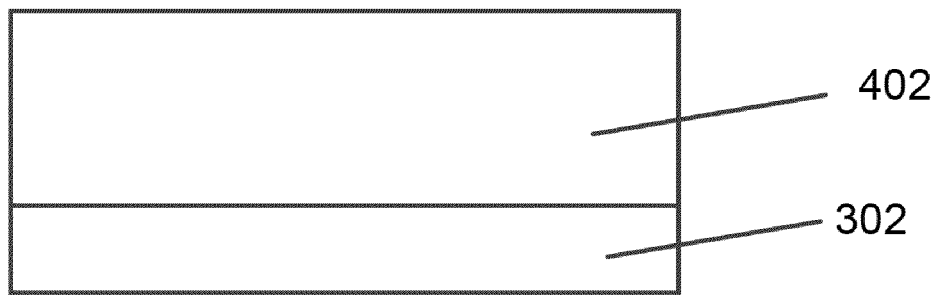

FIGS. 3-18 illustrate a method of fabricating a switching device according to an embodiment of the present invention. The method includes providing a substrate 302 including a surface region 304. The substrate can be a semiconductor substrate such as a silicon wafer and the like. In certain embodiments, the substrate can include one or more devices formed thereon. The one or more devices can include transistor devices, and/or others, depending on the embodiment. As shown in FIG. 4, the method includes forming a first dielectric material 402 overlying the surface region of the substrate. The first dielectric material can be a silicon oxide or a silicon nitride or a suitable dielectric film stack including combinations of different dielectric films. The first dielectric material can be formed using techniques such as chemical vapor deposition, spin on coating, and/or a combination of these techniques. One of skill in the art will appreciate that other similar techniques may be suitable for the forming process.

Figure 5:
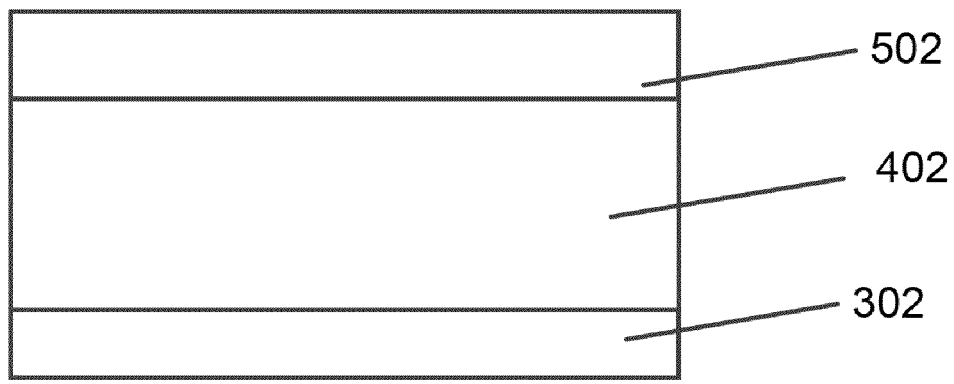
Figure 6:
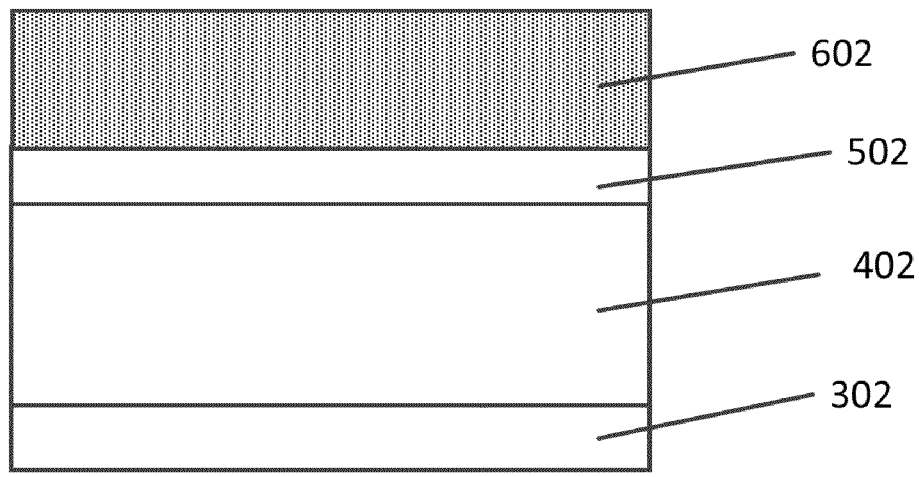

Referring to FIG. 5, the method deposits a first adhesion layer 502 overlying the first dielectric material. The first adhesion layer can be titanium, titanium nitride, tantalum, tantalum nitride, tungsten nitride, or any combinations of these or other similar materials. The first adhesion layer may be formed using physical vapor deposition, chemical vapor deposition, or atomic layer deposition, and the like. In other applications, physical deposition such as sputtering may be used depending on the application. As shown in FIG. 6, a bottom wiring structure 602 is formed overlying the first adhesion layer. The bottom wiring structure material can be aluminum, tungsten, copper, or other suitable metal materials depending on the embodiment. The bottom wiring material can be deposited using techniques such as physical vapor deposition, evaporation, chemical vapor deposition, electro-chemical methods such as electroplating or electrode-less deposition from a liquid medium, or other suitable deposition techniques, or combinations of techniques. In an embodiment shown in FIG. 5, the first adhesion layer facilitates adhesion between the first wiring material and the first dielectric material.

Figure 7:
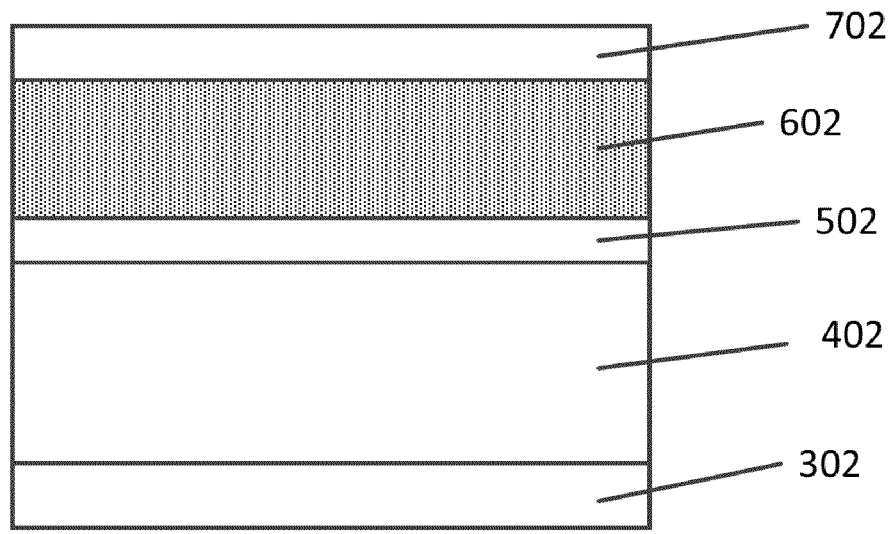

As shown in FIG. 7, a method of forming the switching device includes depositing a second adhesion layer 702 onto the bottom wiring structure material. The second adhesion layer can serve as a barrier layer or a blocking layer to prevent chemical reaction of the bottom wiring structure material with, for example, a switching layer material subsequently formed. The second adhesion layer can be titanium, titanium nitride, tantalum, tantalum nitride, tungsten, tungsten nitride, or others, depending on the embodiment.

Figure 8:
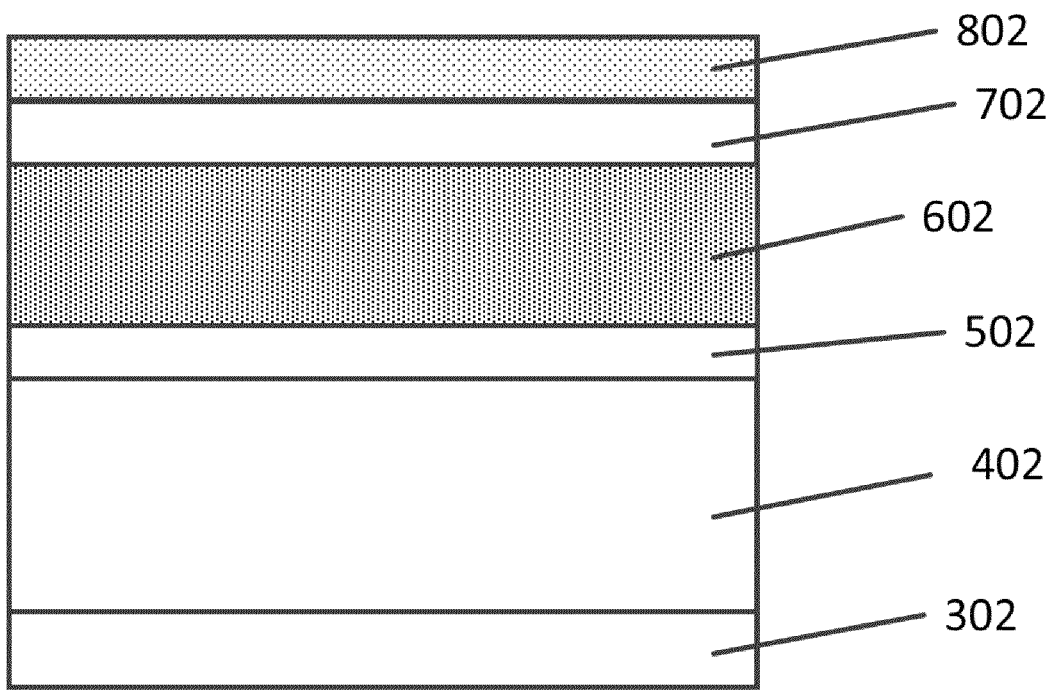

Referring to FIG. 8, the method includes forming a doped semiconductor material 802 overlying the second adhesion layer in a specific embodiment. The doped semiconductor material can be doped polycrystalline silicon, hereinafter referred to as polysilicon. The polysilicon material is used as a contact material between the bottom wiring material and an amorphous silicon switching material in a specific embodiment. In a preferred embodiment, the doped polysilicon material is p+ doped, using impurity such as boron and the like. In some embodiments, the boron has a concentration ranging from about 1E18 to 1E21 $cm^{-3}$. The p+ polycrystalline silicon material can be deposited using a chemical deposition method or a physical deposition method depending on the embodiment. The chemical deposition method can include a chemical vapor deposition process using silane, disilane, a suitable chlorosilane, or any suitable silicon-containing gas as a precursor, and any suitable gas containing a p+ dopant for silicon, such as diborane, $B_2H_6$. In a specific embodiment, the p+ polycrystalline silicon material may be deposited using a plasma-assisted chemical deposition method. Deposition temperature for the p+ silicon material can range from about 200 Degrees Celsius to about 500 Degrees Celsius and preferably at about 400 Degrees Celsius to about 450 Degrees Celsius. In certain embodiments, the polysilicon material may be further processed to enhance the performance of the switching device. For example, defects or nano metal material may be formed in a surface region of the doped polysilicon material to enhance the performance of the switching device. In a specific embodiment, the polysilicon material allows for controlling and improving switching properties of the amorphous silicon switching material. For other switching materials, such as metal oxide, or others, other contact material may be used, or the contact layer may not be needed. Of course, one skilled in the art would recognize other variations, modifications, and alternatives.

Figure 9:
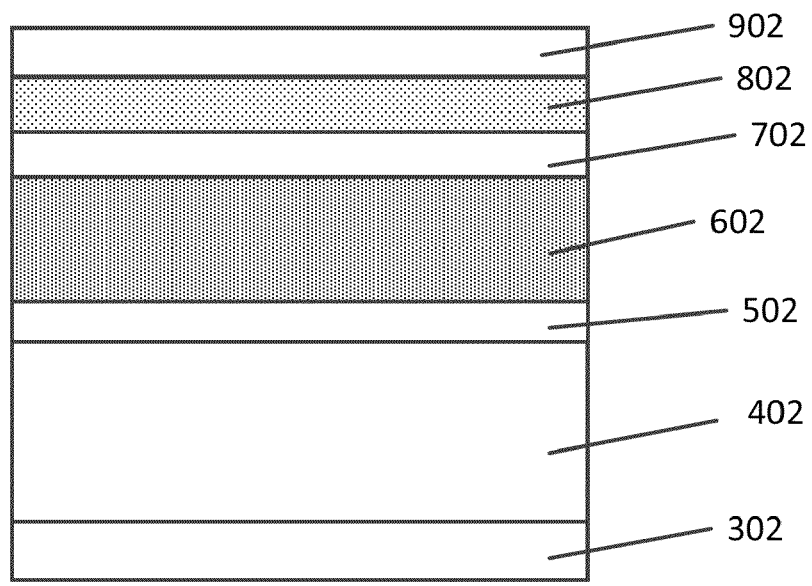

In a specific embodiment, the method forms a switching material 902 overlying the contact material as shown in FIG. 9. The switching material can be an undoped amorphous silicon material having an intrinsic semiconductor characteristic. The undoped amorphous silicon material can be deposited using a chemical deposition method or a physical deposition method depending on the embodiment. The chemical deposition method can include a chemical vapor deposition process using silane, disilane, a suitable chlorosilane, or any suitable silicon-containing gas as a precursor. In a specific embodiment, the undoped amorphous silicon material may be deposited using a plasma-assisted chemical deposition method. Deposition temperature for the amorphous silicon material can range from about 200 Degrees Celsius to about 450 Degrees Celsius and preferably at about 350 Degrees Celsius to about 400 Degrees Celsius. Depending on the embodiment, the amorphous silicon material can be provided at a thickness ranging from about 50 Angstroms to about 1000 Angstroms. In a preferred embodiment, the amorphous silicon material is provided at a thickness ranging from about 100 Angstroms to about 500 Angstroms.

Figure 10:
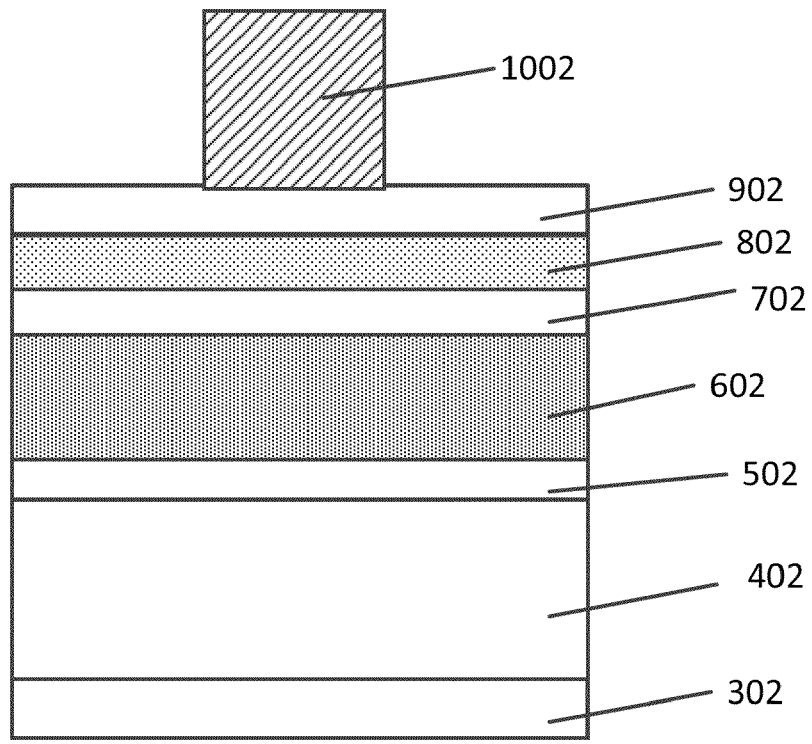

Referring to FIG. 10, the method includes forming a masking layer 1002 overlying the switching material. The masking layer can be a suitable organic photoresist material, or an inorganic hard mask, or a combination of the two, depending on the embodiment. The hard mask can be formed from a dielectric material such as silicon oxide or silicon nitride, or others depending on the application. The hard mask may also be a metal hard mask depending on the embodiment.

Figure 11:
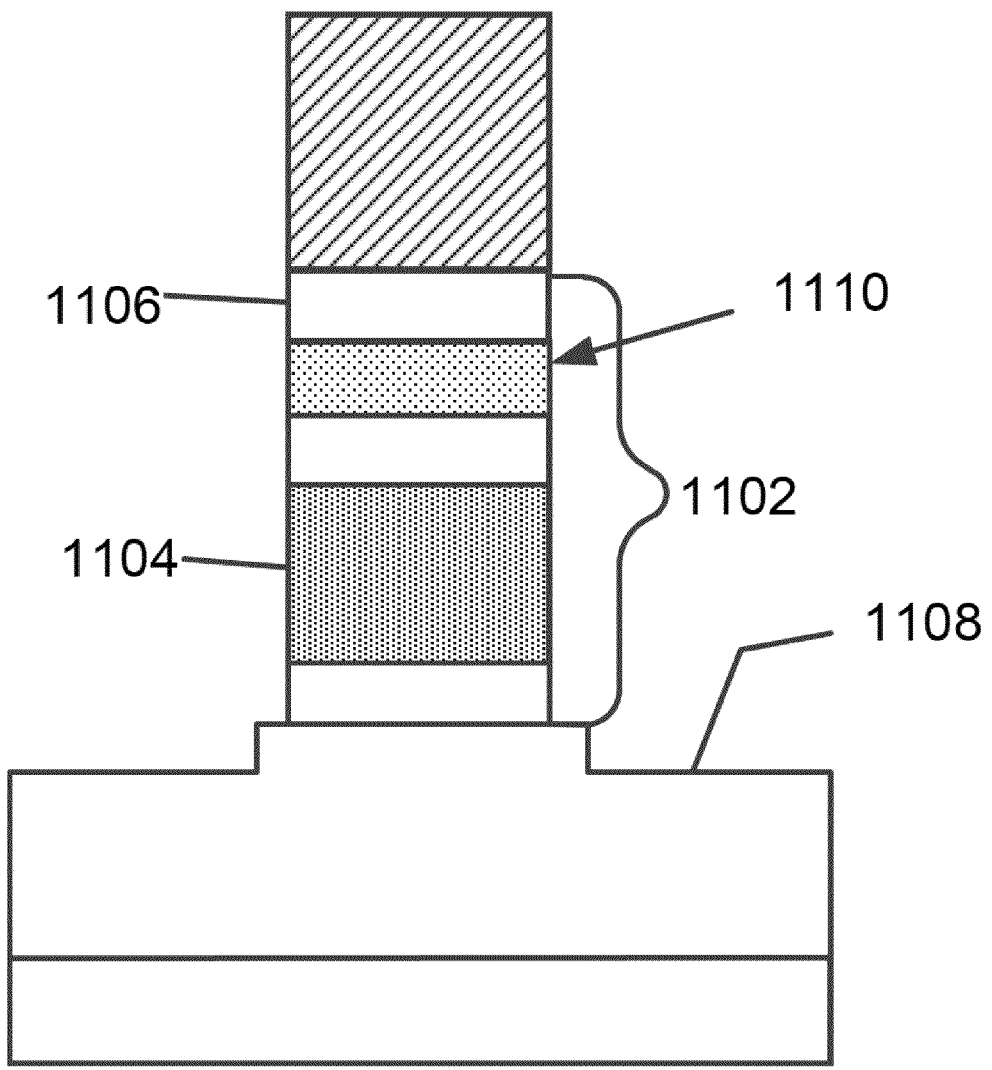

In a specific embodiment, the method subjects the switching material, the contact material, and the bottom wiring structure material to a first etching process using the masking layer as a mask to form a first structure 1102 as shown in FIG. 11. The first etching process selectively removes a portion of the first dielectric material exposing a top surface region 1108 of the first dielectric material. The first structure includes at least a bottom wiring structure 1104, and a switching element 1106 in a specific embodiment. The switching element includes at least a first side region 1110. Depending on the hard mask used, any remaining portion of the hard mask after etching may be removed. Alternatively, the remaining hard mask after etch may be left intact if it is a dielectric.

Figure 12:
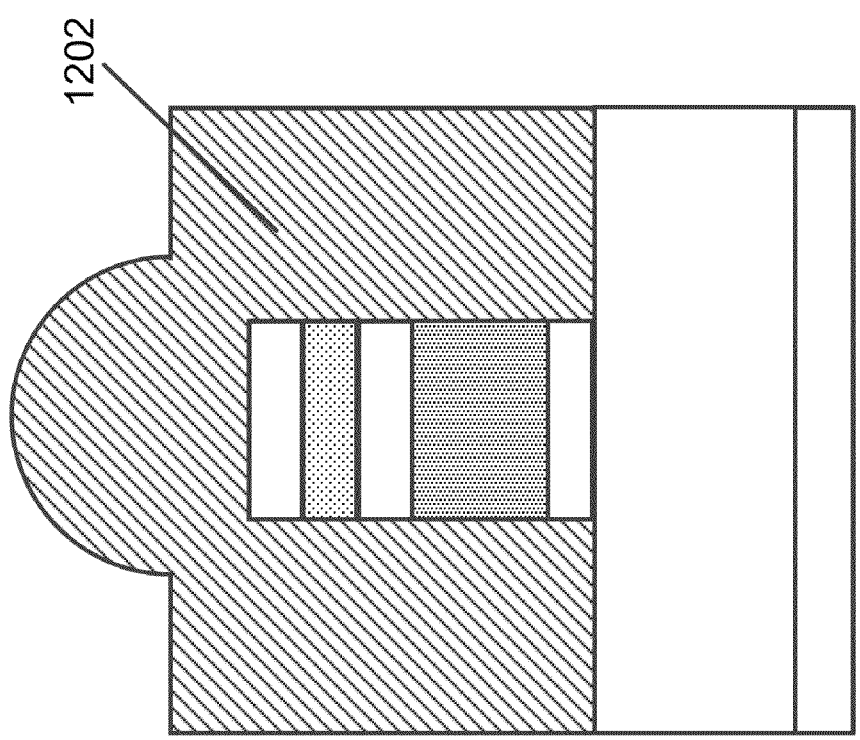

Referring to FIG. 12, the method includes depositing a second dielectric layer 1202 overlying the first structure and exposed portion of the first dielectric layer. The second dielectric material can include a silicon oxide material, a silicon nitride material, or any other suitable dielectric or combination of dielectrics depending on the embodiment. In a specific embodiment, the second dielectric material can be silicon oxide deposited using a plasma enhanced chemical vapor deposition process using tetraethyloxysilicate (commonly known as TEOS), as a precursor. The silicon oxide material may also be formed using a spin on coating technique followed by a suitable curing process. A combination of coating and chemical deposition may also be used depending on the application.

Figure 13:
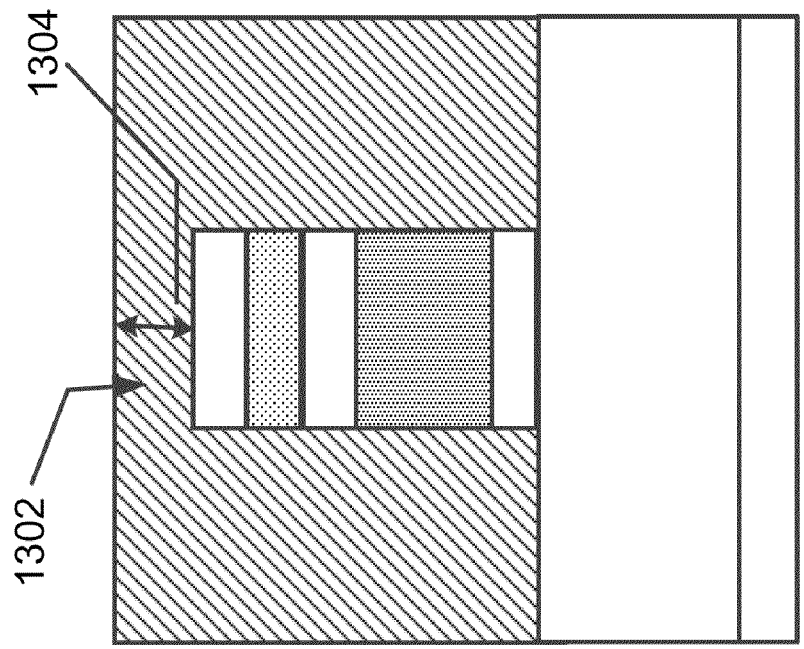
Figure 14:
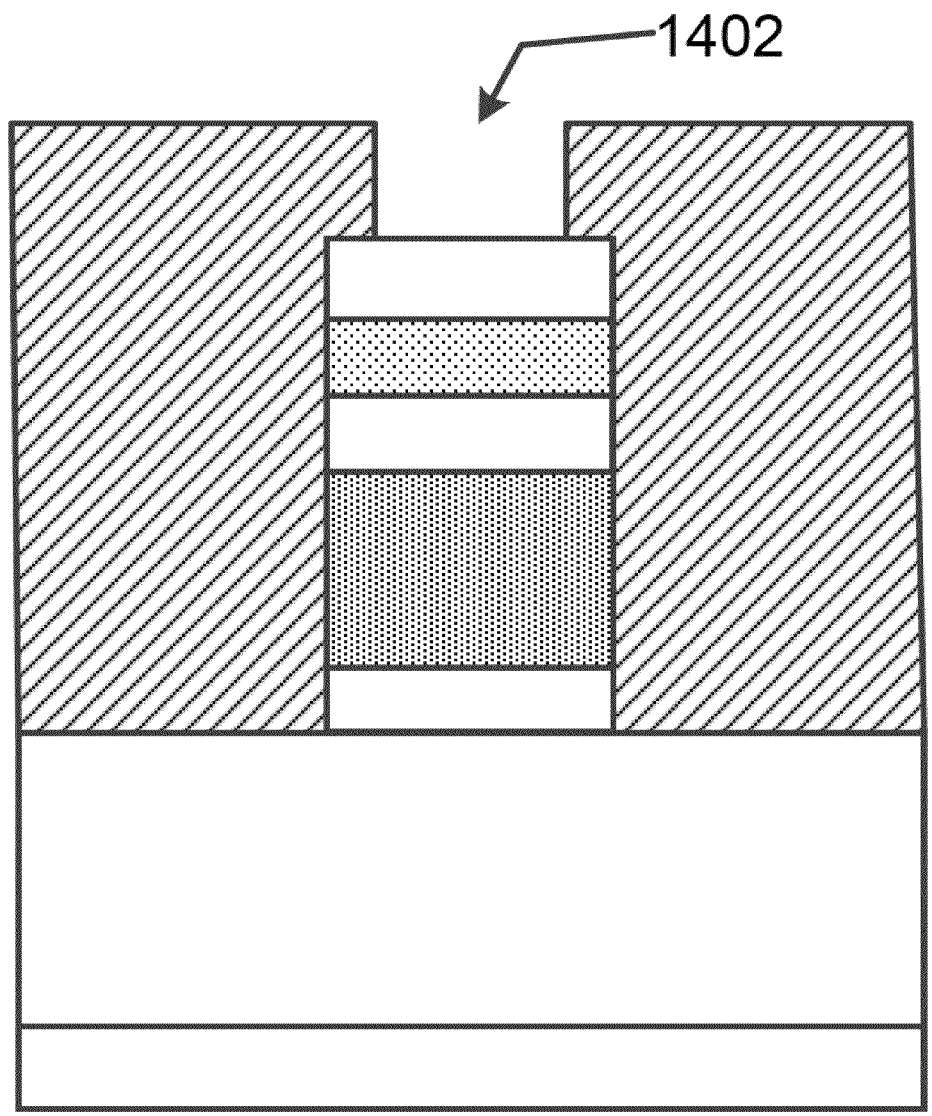
Figure 15:
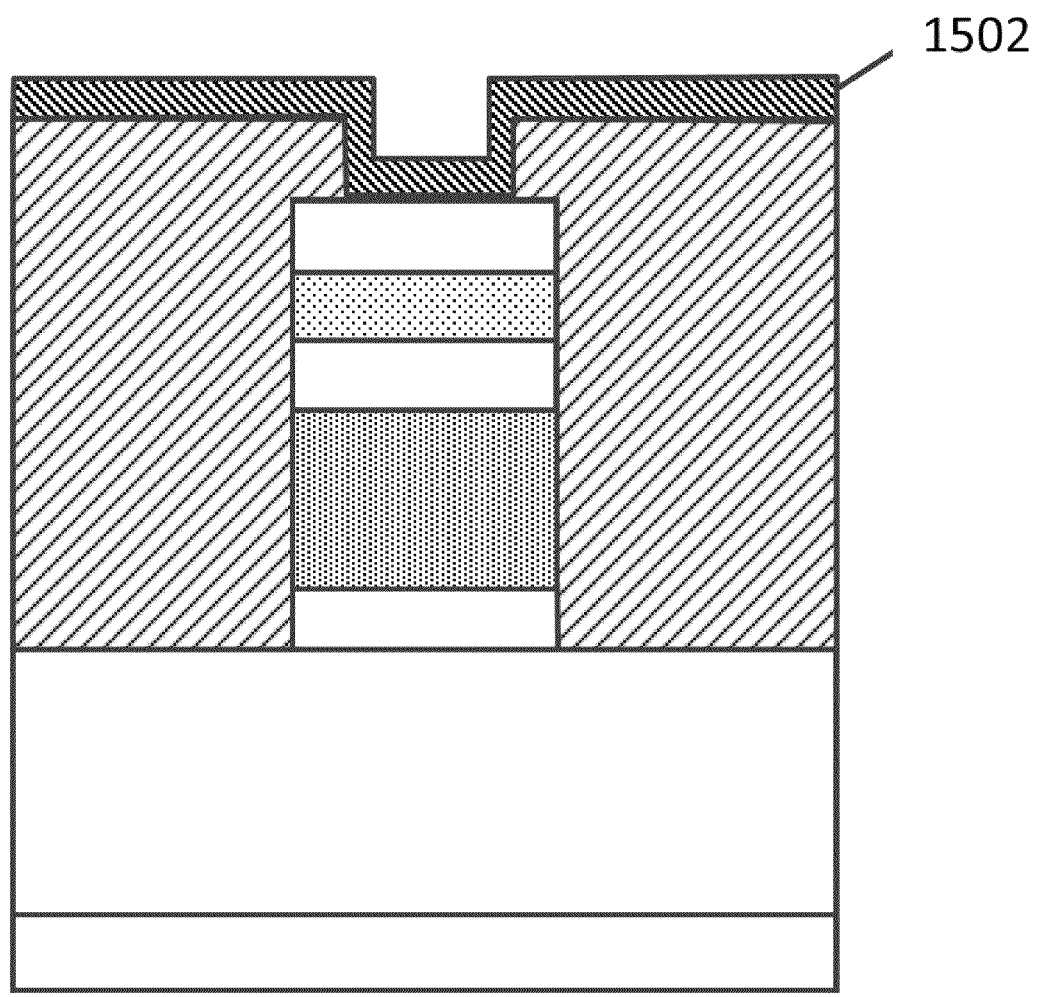

In a specific embodiment, the method employs a planarizing process to form a planarized dielectric surface 1302 as illustrated in FIG. 13. This may be accomplished by a chemical mechanical polishing process, or a non isotropic chemical etch, for example, a blanket etch of the second dielectric material. As shown, a portion 1304 of the second dielectric material is maintained overlying a top region of the switching element. For the embodiment shown in FIG. 14, the method includes forming a first opening region 1402 in a portion of the second dielectric material to expose a portion of the top region of the switching element. The first opening region is formed by using a second patterning and etching process and has a first dimension in a specific embodiment. For example, when silicon dioxide as the dielectric material, the etching process may be a dry etch, such as a fluorine-based etching using $CF_4$, $SF_6$, or $NF_3$, as the etching gas. A suitable wet etching technique, such as a HF-based etching may also be used depending on the embodiment. Alternatively, laser ablation may be used to selectively remove the silicon oxide material overlying the switching material to form the first opening region.

In an embodiment shown in FIG. 5, the method includes forming a third dielectric material 1502 overlying the second dielectric material including the first opening region. As shown, the third dielectric material is conformably formed to overly the second dielectric material and the first opening region in a specific embodiment. The third dielectric material can be silicon nitride in a specific embodiment. Other suitable dielectric materials such as silicon oxide or a dielectric stack (for example, a silicon oxide on silicon nitride on silicon oxide stack, commonly known as ONO) may also be used depending on the embodiment.

Figure 16:
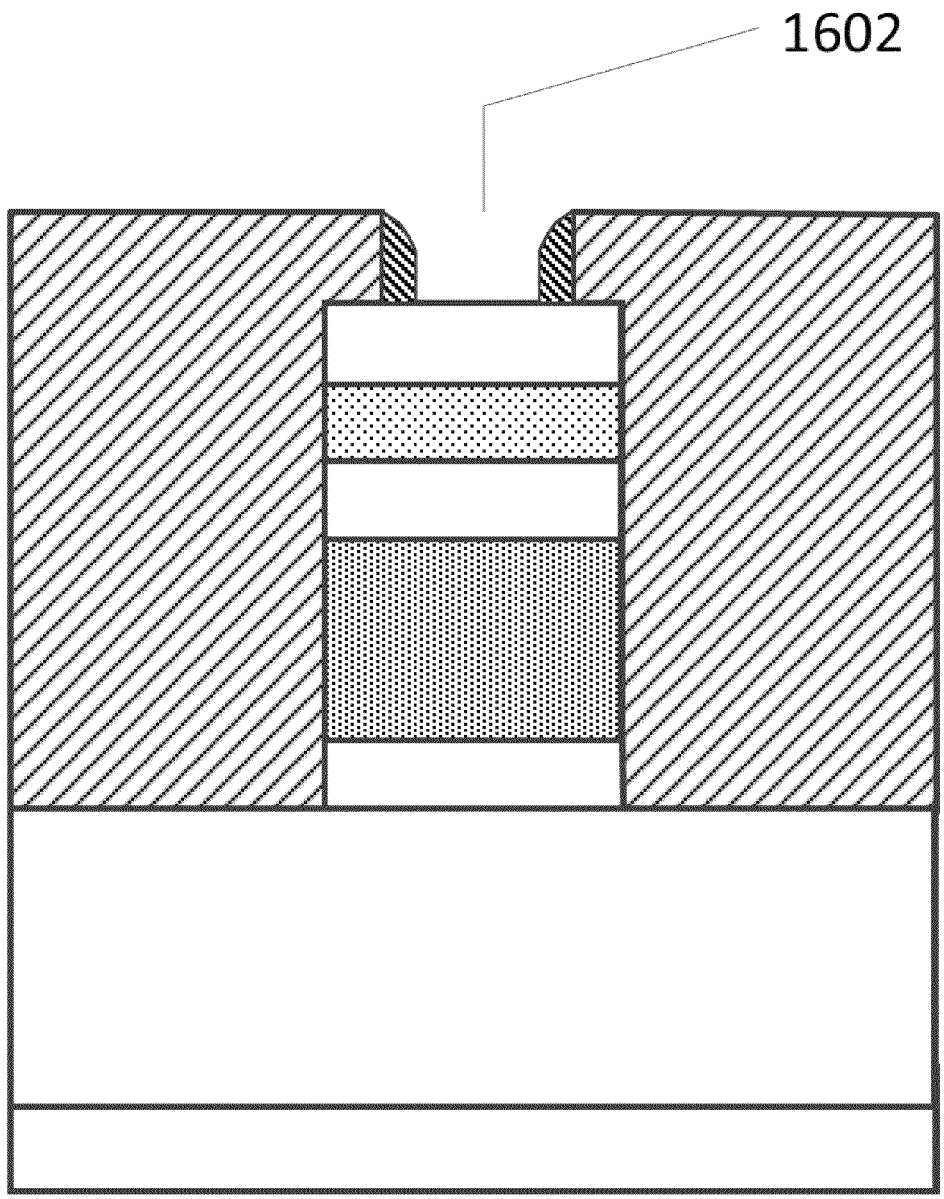

Referring to FIG. 16, the method subjects the third dielectric material to a nonconformal or an anisotropic etching process to remove a portion of the third dielectric material to form a second opening region 1602. As shown, the anisotropic etching process forms a side wall structure 1604 overlying the side region of the first opening region and a bottom region thereof. The bottom region includes an exposed portion of the switching material in a specific embodiment. This etch is commonly used in semiconductor processing, and is known as a "sidewall spacer" etch. The exposed portion has a second dimension, which is less than the first dimension.

Referring to FIG. 17, the method shown in this embodiment includes forming a conductive material 1702 overlying at least the bottom region and the side wall structure. The conductive material can substantially fill the second opening region and be in contact with the switching material in a specific embodiment. Alternatively, the conductive material can be conformably formed overlying the second opening region including the bottom region and the side wall structure depending on the deposition conditions. The conductive material is in contact with the switching element, as shown. In a specific embodiment, for an amorphous silicon switching material, the conductive material can be a silver material. The silver material can be deposited using a physical deposition process such as sputtering or evaporation. The silver material may also be formed using a chemical deposition process such as chemical vapor deposition, an electrochemical process such as electroplating or electroless plating, or a combination of processes depending on the application.

An embodiment of the method shown in FIG. 18, includes forming a top barrier material 1802 overlying at least the conductive material and a top wiring material 1804 overlying the top barrier material. The top barrier material can be a top adhesion material in a specific embodiment. The top barrier material can be titanium, titanium nitride, tantalum, tantalum nitride, tungsten, tungsten nitride, or any suitable barrier material depending on the embodiment. Depending on the application, top barrier material 1802 can be formed using a chemical deposition process such as atomic layer deposition, chemical vapor deposition, and others, or a physical deposition process such as sputtering, depending on the application. Top barrier material 1802 can protect the conductive material. For example, if the conductive material is silver material in a certain embodiment, the top barrier material can prevent oxidation of the silver. The top barrier material can also be a diffusion barrier between the conductive material and the top wiring material in a specific embodiment.

Again, depending on the embodiment, the top wiring material can be aluminum, tungsten, copper, or others. The top wiring structure material may be deposited using techniques such as a physical vapor deposition process, for example, sputtering, evaporation, and others. The top wiring material may also be deposited using chemical deposition such as chemical vapor deposition, or electrochemically including electroplating and electrodeless deposition depending on the embodiment.

In a specific embodiment, the method subjects a stack of material comprising the top wiring material, the top barrier material, and the contact material to a third pattern and etch process to from a top wiring structure. In a specific embodiment, the conductive material is in contact with the switching element. The top wiring structure is configured spatially at an angle to the bottom wiring structure to form a crossbar structure in a specific embodiment. In a specific embodiment, the top wiring structure is configured spatially orthogonal to the bottom wiring structure. The switching element is disposed in an intersection region of the top electrode structure and the bottom electrode structure. As an example, for a switching device using an amorphous silicon material as the switching material, the stack of material can comprise aluminum, titanium nitride, and silver, while silver is in contact with the amorphous silicon material. One skilled in the art would recognize other variations, modifications, and alternatives to the methods, materials and structures described above.

In a specific embodiment, the conductive material forms a plurality of conductive material particles including a filament structure in a portion of the switching material when a suitable voltage is applied to the top wiring structure or the bottom wiring structure. Formation of this filament changes the resistance of the switching material in a specific embodiment. Taking silver material as the conductive material and amorphous silicon as the switching material as an example, upon applying a positive voltage to the top wiring structure, a plurality of silver particles are formed in defect regions of the amorphous silicon material. The plurality of silver particles can include a silver filament structure having a length. The length of the silver filament structure can change upon applying a suitable voltage, thus changing the resistance of the amorphous silicon material. Such a device structure is described in U.S. application Ser. No. 11/875,541, filed on Oct. 19, 2007, commonly assigned, and incorporated by reference in its entirety herein.

In a specific embodiment, a switching device is provided. The switching device includes a substrate and a first dielectric material overlying the substrate. The substrate is a semiconductor substrate in a specific embodiment. The substrate can include one or more CMOS devices formed thereon and operably connected to the switching device in certain embodiments. The switching device includes a bottom wiring structure overlying the first dielectric material. The bottom wiring structure includes at least a metal material selected from tungsten, copper, and aluminum in a specific embodiment.

In a specific embodiment, the switching device includes a first structure. The first structure includes at least a contact material overlying the bottom wiring structure and a switching material overlying the contact layer. In an embodiment, the contact material includes a p+ doped polysilicon material, and the switching material includes an amorphous silicon material. In certain embodiments, the p+ doped polysilicon material is doped using boron as the impurity at a concentration ranging from about 1E18 to about 1E21 atoms per $cm^3$ depending on the application. The p+ doped silicon material can have a thickness ranging from about 50 Angstroms to about 2000 Angstroms and preferably 100 Angstroms to about 500 Angstroms. Depending on the embodiment, the amorphous silicon material can have a thickness ranging from 50 Angstroms to about 2000 Angstroms and preferably 100 Angstroms to about 500 Angstroms. In a specific embodiment, the first structure has a top surface region and a side region, the top surface region including a top region of the switching material. The switching device includes a second dielectric layer overlying the first structure and a side wall spacer structure provided in a first opening region of the second dielectric layer. The first opening region includes a portion of the top surface region of the switching material. In a specific embodiment, the side wall spacer structure is formed using a third dielectric material. The third dielectric material can be silicon nitride in a specific embodiment. The first opening region defines an active device area in a specific embodiment.

In a specific embodiment, the present switching device includes a conductive material overlying the first opening region. The conductive material overlies the side wall structure and the conductive material is in contact with the switching material in a preferred embodiment. A top wiring structure overlies the conductive material in a specific embodiment. The conductive material can be silver, gold, platinum, or palladium, an alloy of these metals, or a combination, depending on the application. For amorphous silicon as the switching material, the conductive material can use silver at a thickness ranging from 50 Angstroms to about 2000 Angstroms in a specific embodiment. The top wiring structure can include a metal material selected from tungsten, copper, and aluminum depending on the embodiment.

In a specific embodiment, the switching device is further characterized by an ON state current and an OFF state current. The ON state current is independent of an area of the first opening region and the OFF state current being inversely proportional to the area in a specific embodiment.

Accordingly, embodiments of the present invention provide a method and a device structure to form a switching device having an increased ON current to OFF current ratio. Such increase is provided by forming a side wall structure to reduce an active device area without using a lithography mask, which can be costly for fine feature size less than about 50 nm. The active device area is defined by a contact region of the top wiring structure and the switching material, for example between conductive material and the switch material in a specific embodiment. Though the present method has been applied to a device structure having an Ag/amorphous silicon/p+ polysilicon configuration and tungsten material as the top wiring material and the bottom wiring material, it should be recognized that the present method can be applied in fabrication of a switching device where switching is dependent on the mechanism of forming a conductive path or conductive particles in a switching material.

It is also understood that the examples and embodiments described herein are for illustrative purposes only and that various modifications or alternatives in light thereof will be suggested to persons skilled in the art and are to be included within the spirit and purview of this application and scope of the appended claims.

What is claimed:

1. A method for forming a switching device, comprising:
   providing a substrate having a surface region;
   forming a first dielectric material overlying the surface region;
   forming a first structure comprising at least a bottom wiring structure and a switching element overlying the first dielectric material, the first structure comprising an exposed top surface region of the switching element;
   depositing a second dielectric material overlying at least the exposed top surface region of the switching element;
   forming a first opening region in a portion of the second dielectric material, the first opening region having a side region and a bottom region, the bottom region including the exposed top surface region of the switching element, the bottom region being characterized by a first area;
   depositing a third dielectric material conformably overlying at least the first opening region;
   subjecting the third dielectric material to an anisotropic etching process to form a second opening region, the anisotropic etching process removing a first portion of the third dielectric material to expose a first portion of the bottom region while a second portion of the third dielectric material remaining on the side region to form a sidewall structure overlying the side region of the first opening region, the first portion of the bottom region being characterized by a second area;
   depositing a conductive material overlying the first portion of the bottom region and the sidewall structure, the conductive material being in contact with the switching element, and
   forming a top wiring structure comprising at least the conductive material,
   wherein the switching device comprises the top wiring structure, the switching element, and the bottom wiring structure.

2. The method of claim 1 wherein the conductive material substantially fills the second opening region and at least a portion of the conductive material forms a portion of the top wiring structure.

3. The method of claim 1 wherein the conductive material is conformably formed overlying at least the second opening region and at least a portion of the conductive material forms a portion of the top wiring structure.

4. The method of claim 1 wherein the second area is less than the first area, the second area defining an active device area.

5. The method of claim 1 wherein the second area is less than about 90 nm by 90 nm.

6. The method of claim 1 wherein the second area is less than about 50 nm by 50 nm.

7. The method of claim 1 wherein the switching device is further characterized by an off-state current and an on-state current, the off-state current is inversely proportional to the second area and the on-state current is essentially independent of the second area.

8. The method of claim 1 wherein forming the first structure comprises:
   depositing a first bottom barrier material overlying the first dielectric material;
   depositing a bottom wiring material overlying the first bottom barrier material;
   depositing a second bottom barrier material overlying the bottom wiring material;
   depositing a contact material overlying the second bottom barrier material;
   depositing a switching material overlying the contact material;
   forming a first masking layer overlying the switching material; and
   subjecting the switching material, the contact material, the second bottom barrier material, the bottom wiring material, and the first bottom barrier material to a directional etching process using the first masking layer as a mask.

9. The method of claim 8 wherein the contact material comprises a polysilicon material.

10. The method of claim 9 wherein the polysilicon material is p-doped.

11. The method of claim 10 wherein the polysilicon material is doped using a boron bearing species having a concentration ranging from about 10E17 cm-3 to about 10E21 cm-3.

12. The method of claim 9 wherein the polysilicon material has a thickness ranging from about 100 Angstroms to about 2000 Angstroms.

13. The method of claim 9 wherein the polysilicon material has a thickness ranging from about 100 Angstroms to about 500 Angstroms.

14. The method of claim 1 wherein the top wiring structure and the bottom wiring structure are spatially disposed in an orthogonal configuration.

15. The method of claim 1 wherein the substrate comprises a semiconductor substrate.

16. The method of claim 1 wherein the substrate includes one or more CMOS devices fabricated thereon, the switching device is operably coupled to the one or more CMOS devices.

17. The method of claim 1 wherein at least one portion of the top wiring structure and at least one portion of the bottom wiring structure are independently selected from a group consisting of: tungsten, aluminum, or copper.

18. The method of claim 1 wherein the switching element comprises an amorphous silicon material having intrinsic semiconductor characteristics.

19. The method of claim 18 wherein the amorphous silicon material has a thickness ranging from about 50 Angstroms to about 2000 Angstroms.

20. The method of claim 18 wherein the amorphous silicon has a thickness ranging from about 100 Angstroms to about 500 Angstroms.

21. The method of claim 1 wherein the conductive material is a metal material selected from a group consisting of: gold, platinum, silver, palladium, nickel, or copper, including any combination of these.

22. The method of claim 21 wherein the conductive material comprises a silver material having a thickness ranging from about 50 Angstroms to about 2000 Angstroms.

23. The method of claim 22 wherein the silver material has a thickness ranging from about 100 Angstroms to about 500 Angstroms.

24. The method of claim 1 further comprises planarizing the second dielectric material using a process selected from a group consisting of: an etch back process, an isotropic etching process, or a chemical mechanical polishing process, or a combination before forming the first opening region.

25. The method of claim 1 wherein the top wiring material further includes a material selected from a group consisting of: a second adhesion material or a second barrier material.

26. The method of claim 1 wherein forming the opening region in a portion of the second dielectric layer includes a second masking and dielectric etching process.

27. The method of claim 1 wherein the third dielectric material is selected from a group consisting of: silicon oxide, silicon nitride, silicon oxide on silicon nitride on silicon oxide (ONO) stack.

28. The method of claim 1 wherein the subjecting the third dielectric material to an anisotropic etching process uses at least $C_2F_6$ as an etching gas.

29. The method of claim 1 wherein forming the top wiring structure comprises:
   depositing a top barrier material overlying the conductive material;
   depositing a top wiring material overlying the top barrier material, and
   subjecting the conductive material, the top barrier material, and the top wiring material to a third pattern and etching process.

30. The method of claim 1 wherein the conductive material is configured to form a conductive material region in a portion of the switching element upon application of a positive voltage to the top wiring structure to change a resistance characteristic of the switching element.

* * * * *